United States Patent
Lin et al.

(10) Patent No.: US 7,667,821 B2
(45) Date of Patent: Feb. 23, 2010

(54) MULTI-FOCUS SCANNING WITH A TILTED MASK OR WAFER

(75) Inventors: Burn-J. Lin, Hsin-Chu (TW);
Chun-Kuang Chen, Hsin-Chu (TW);
Tsai-Sheng Gau, Hsin Chu (TW);
Chia-Hui Lin, Hsin-Chu (TW); Ru-Gun Liu, Yungkang (TW); Jen-Chieh Shih, Yongkang (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 11/064,322

(22) Filed: Feb. 23, 2005

(65) Prior Publication Data

US 2005/0270508 A1 Dec. 8, 2005

Related U.S. Application Data

(60) Provisional application No. 60/577,135, filed on Jun. 4, 2004.

(51) Int. Cl.
*G03B 27/42* (2006.01)
*G03B 27/52* (2006.01)

(52) U.S. Cl. .......................... 355/53; 355/55

(58) Field of Classification Search ............ 355/52, 355/53, 55, 67–71, 72, 75, 77; 250/548; 356/399–401; 430/311, 320
See application file for complete search history.

(56) References Cited

U.S. PATENT DOCUMENTS

| | | |
|---|---|---|
| 5,192,882 A | 3/1993 | Lipovski |
| 5,481,473 A | 1/1996 | Kim et al. |
| 5,497,334 A | 3/1996 | Russell et al. |
| 5,519,628 A | 5/1996 | Russell et al. |
| 5,528,508 A | 6/1996 | Russell et al. |
| 5,625,803 A | 4/1997 | McNelly et al. |
| 5,692,160 A | 11/1997 | Sarin |
| 5,727,187 A | 3/1998 | Lemche et al. |
| 5,737,237 A | 4/1998 | Tanaka et al. |
| 5,739,899 A * | 4/1998 | Nishi et al. ............... 355/53 |
| 5,828,579 A | 10/1998 | Beausang |
| 5,949,692 A | 9/1999 | Beausang et al. |
| 5,984,510 A | 11/1999 | Guruswamy et al. |

(Continued)

FOREIGN PATENT DOCUMENTS

JP 214612 8/1992

OTHER PUBLICATIONS

Hiroshi Fukuda et al. A New Method for Enhancing Focus Latitude in Optical Lithography: Flex IEEE Electron Device Letters, vol. EDL-8, No. 4 Apr. 1987.

(Continued)

*Primary Examiner*—Hung Henry Nguyen
(74) *Attorney, Agent, or Firm*—Duane Morris LLP

(57) ABSTRACT

A method for implementing discrete superpositioning of two or more defocal wafer images at different defocal positions in a lithographic step and scan projection system. The method includes tilting one of a mask and a wafer with respect to a scanning direction and splitting an illumination beam into at least two illumination areas which are in different defocus zones of the mask.

21 Claims, 12 Drawing Sheets

U.S. PATENT DOCUMENTS

| | | |
|---|---|---|
| 5,987,086 A | 11/1999 | Raman et al. |
| 6,006,024 A | 12/1999 | Guruswamy et al. |
| 6,058,252 A | 5/2000 | Noll et al. |
| 6,094,305 A * | 7/2000 | Shiraishi ............... 359/558 |
| 6,106,568 A | 8/2000 | Beausang et al. |
| 6,113,647 A | 9/2000 | Silve et al. |
| 6,170,080 B1 | 1/2001 | Ginetti et al. |
| 6,209,123 B1 | 3/2001 | Mazlasz et al. |
| 6,218,077 B1 | 4/2001 | Jin |
| 6,295,627 B1 | 9/2001 | Gowni et al. |
| 6,357,035 B1 | 3/2002 | Gowni et al. |
| 6,370,679 B1 | 4/2002 | Chang et al. |
| 6,388,734 B1 * | 5/2002 | Tokuda et al. ............... 355/53 |
| 6,453,452 B1 | 9/2002 | Chang et al. |
| 6,467,073 B1 | 10/2002 | Merchant |
| 6,470,489 B1 | 10/2002 | Chang et al. |
| 6,530,073 B2 | 3/2003 | Morgan |
| 6,552,776 B1 * | 4/2003 | Wristers et al. ............... 355/67 |
| 6,641,981 B1 * | 11/2003 | Kaneko et al. ............... 430/311 |
| 2001/0003480 A1 * | 6/2001 | Ryuk et al. ............... 355/53 |
| 2002/0041368 A1 * | 4/2002 | Ota et al. ............... 355/55 |

OTHER PUBLICATIONS

Hiroshi Fukuda et al. Improvement of Defocus Tolerance in a Half-Micron Optical Lithography by the Focus Latitude Enhancement Exposure Method: Simulation and Experiment; Central Research Laboratory, Hitachi Ltd., Higashi-Koigakubo , Kokubunji, Tokyo 185, Japan Received Dec. 21, 1988; accepted Apr. 8, 1989.

* cited by examiner

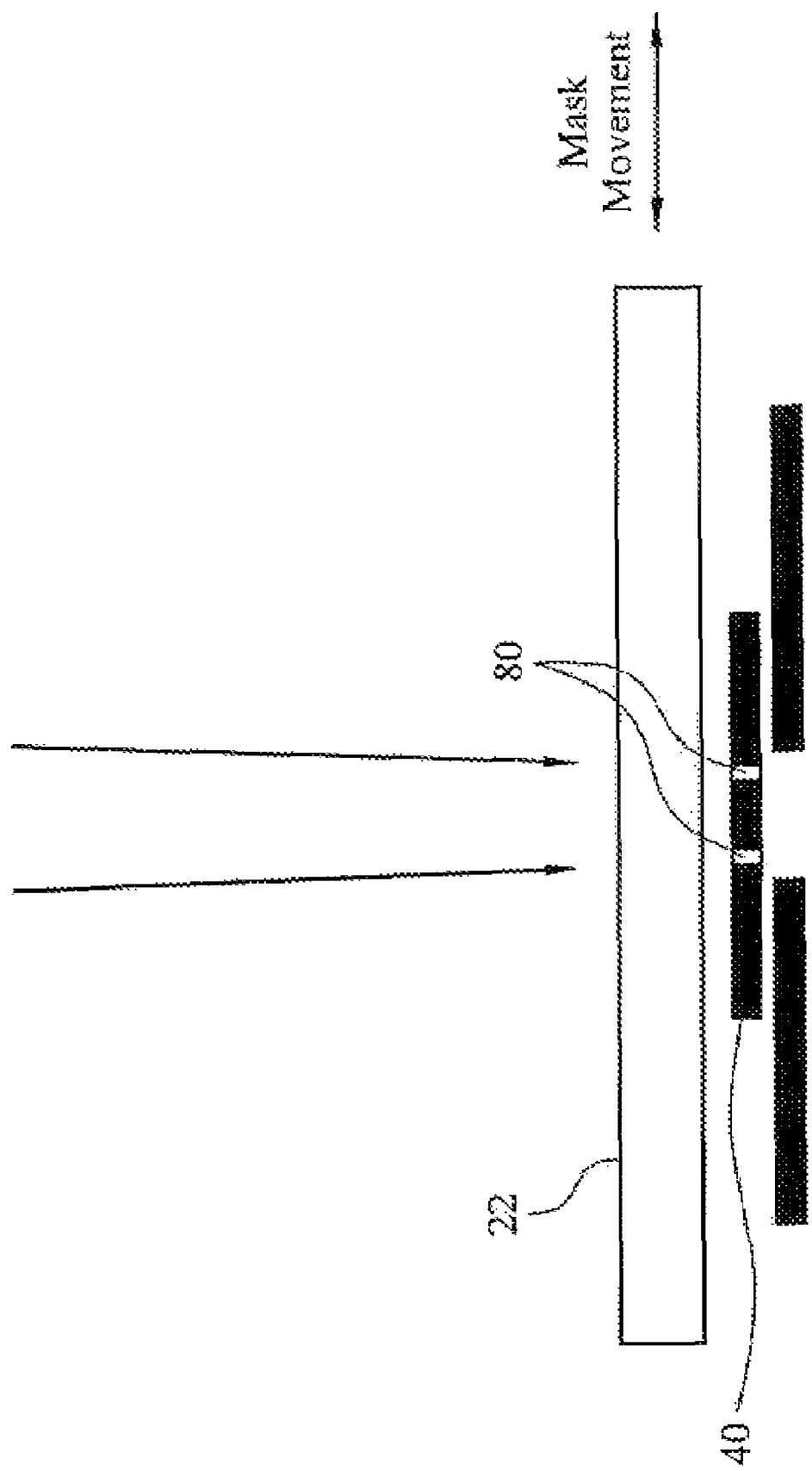

MULTI-FOCUS SCANNING WITH A TILTED MASK OR WAFER

RELATED APPLICATIONS

This application claims the benefit of U.S. Provisional Application No. 60/577,135, filed on Jun. 4, 2004, the entire disclosure of which is incorporated herein by reference.

FIELD OF THE INVENTION

The present invention relates to photolithography for semiconductor fabrication. More particularly, the present invention relates to a scanning method for improving wafer image depth-of-focus (DOF) of a lithographic step and scan projection system.

BACKGROUND OF THE INVENTION

Lithographic step-and scan projection systems are well known in the art. FIG. 1 is a schematic diagram of a conventional lithographic step-and-scan projection system 10. The step-and-scan system 10 comprises an illumination source 12 for generating an illumination beam, a mirror and lens system 16 for manipulating the illumination beam, an optical slit 24 for confining the illumination beam, and an imaging lens 26 for focusing the confined, illumination beam on a resist-coated wafer 20 to be printed. The step-and-scan system 10 may also comprise a tilting wafer stage 18 for holding and tilting the wafer 20 to be printed, and/or a tilting mask holder 22 for holding and tilting a mask having a mask pattern.

The lithographic step-and-scan projection system 10 of FIG. 1 is inherently suitable for superimposing images in a range of defocus from a given mask pattern, resulting in improvement of DOF. When images are superpositioned, the higher contrast in the focal image can make up for the lower contrast in the defocused images. Hence, when the image contrast at the focal plane is more than sufficient, there is room to raise the contrast of the combined image, to the contrast required for line width control. Continuous, defocal image superimposing is simply achieved by tilting either the mask 22 (FIG. 1) or the wafer 20 (FIG. 2) with respect to the optical path O during scanning.

However, improving the DOF with this continuous superposition of defocal images is less effective than simply superimposing two discrete defocal images. More specifically, FIG. 3 shows the exposure-defocus plot of a continuously superimposed contact-hole wafer image having a DOF on the order of 0.236 µm at 9.5% exposure latitude. The exposure conditions were set to numerical aperture (NA)=0.2, σ (sigma)=0.5, at a wavelength of exposure radiation (λ)=13.4 nm for contact hole at pitch=70 nm, and nominal critical dimension (CD)=35 nm. The parameter σ is an aperture ratio, i.e., the ratio of the NA of the condenser lens over the NA of the imaging lens, that indicates the degree of partial coherence of the illumination and imaging system. The larger the sigma, the lower the degree of coherence. As can be seen from FIG. 3, scanning with a tilted mask or wafer produced a range of continuous defocal wafer images of about 0.96 µm. On the other hand, FIG. 4 shows the exposure-defocus plot of a contact-hole image exposed using discrete superimposition of two, discrete contact-hole wafer images, which are at two different defocal positions. As can be seen, scanning using discrete superimposition of two images at a defocal distance of 0.48 µm between them, i.e., the distance between the two defocal positions, produced a DOF on the order of 0.415 µm, at substantially the same exposure energy latitude.

Accordingly, a method is needed for implementing discrete superpositioning of two or more defocal wafer images at different defocal positions in a lithographic step and scan projection system.

SUMMARY OF THE INVENTION

A method is disclosed for implementing discrete superpositioning of two or more defocal wafer images in a lithographic step and scan projection system. The method comprises tilting one of a mask and a wafer with respect to a scanning direction and splitting an illumination beam into at least two illumination areas which are in different defocus zones of the mask.

Also disclosed is a lithographic step-and-scan projection system capable of discrete superpositioning of two or more defocal wafer images at different defocal positions. The system comprises an illumination source for generating an illumination beam and a tilting wafer stage for holding a wafer to be printed. The system tilts one of the wafer and a mask with respect to a scanning direction, and splits the illumination beam into at least two illumination areas which are in different defocus zones of the mask.

BRIEF DESCRIPTION OF THE DRAWINGS

FIG. 13A is a schematic illustration of an illumination beam generated by lithographic step-and-scan projection system of FIG. 1 when scanning according to a further embodiment of the present invention.

DETAILED DESCRIPTION OF THE INVENTION

The present invention is a scanning method for improving wafer image depth-of-focus (DOF) of a lithographic step and scan projection system. The scanning method of the present invention combines tilted mask or tilted wafer scanning with discrete superposition of defocal wafer images. The method retains the DOF improvements provided by scanning in the conventional tilted mode, with a smaller tilt angle, e.g., $2 \times 10^{-4}$ radians (conventional) vs. $1 \times 10^{-4}$ radians (present invention). Alternatively, with the same tilt angle, this method realizes further improvements in DOF with discrete superpositioning. The method also allows the step and scan projection system to be easily switched between discrete defocal wafer image superpositioning and conventional scanning without mask or wafer tilting.

Figure 1:
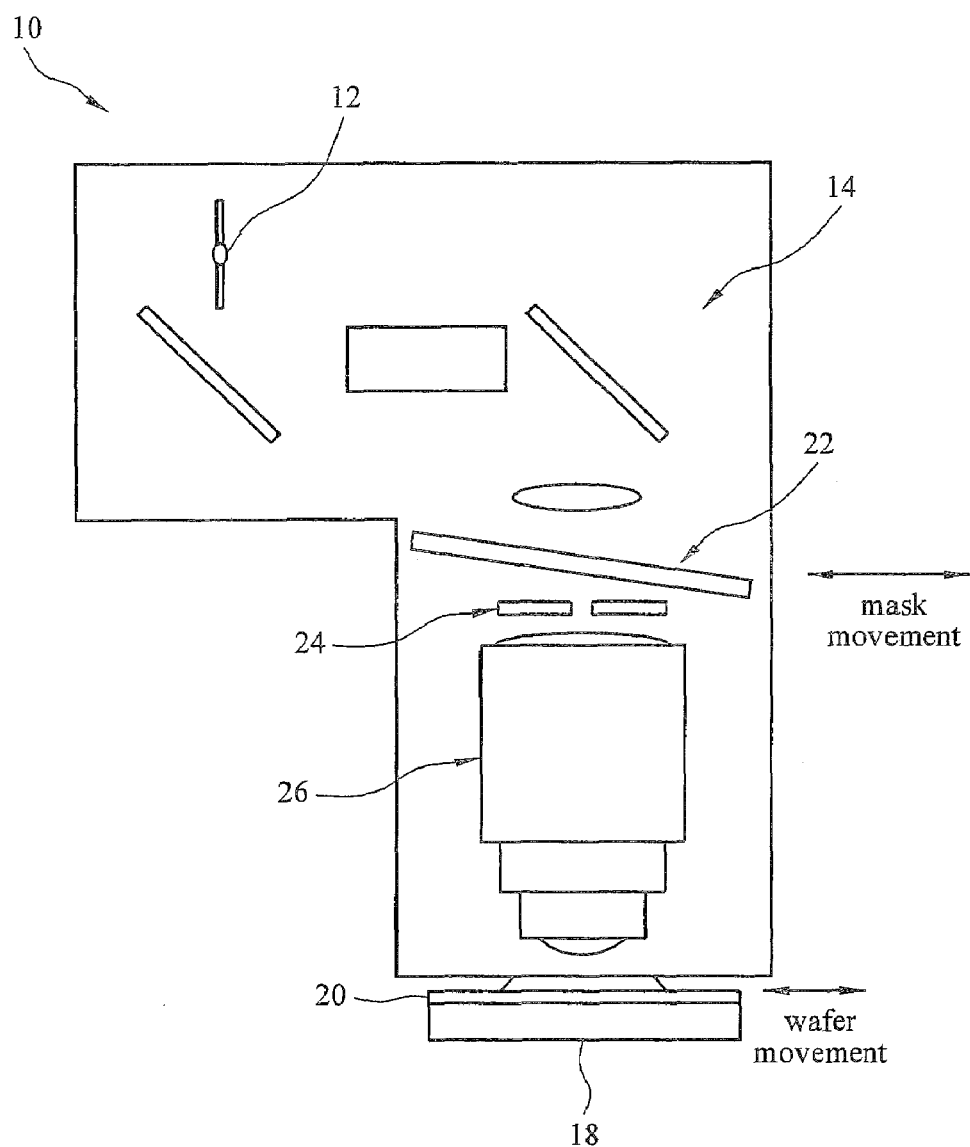
FIG. 1 is a schematic illustration of an exemplary embodiment of a lithographic step-and-scan projection system scanning in a tilted mask mode.
Figure 2:
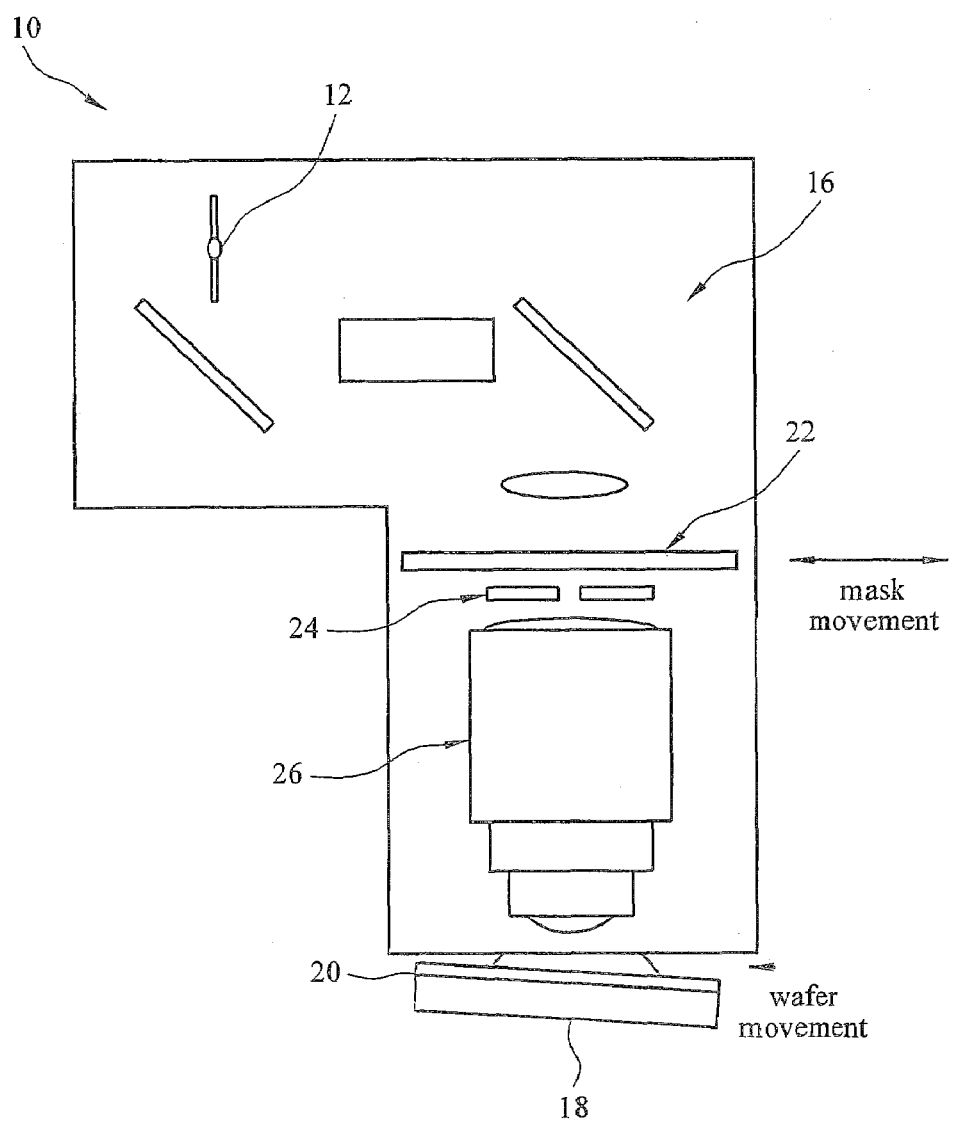
FIG. 2 is a schematic illustration of the lithographic step-and-scan projection system of FIG. 1 scanning in a tilted wafer mode.
Figure 3:
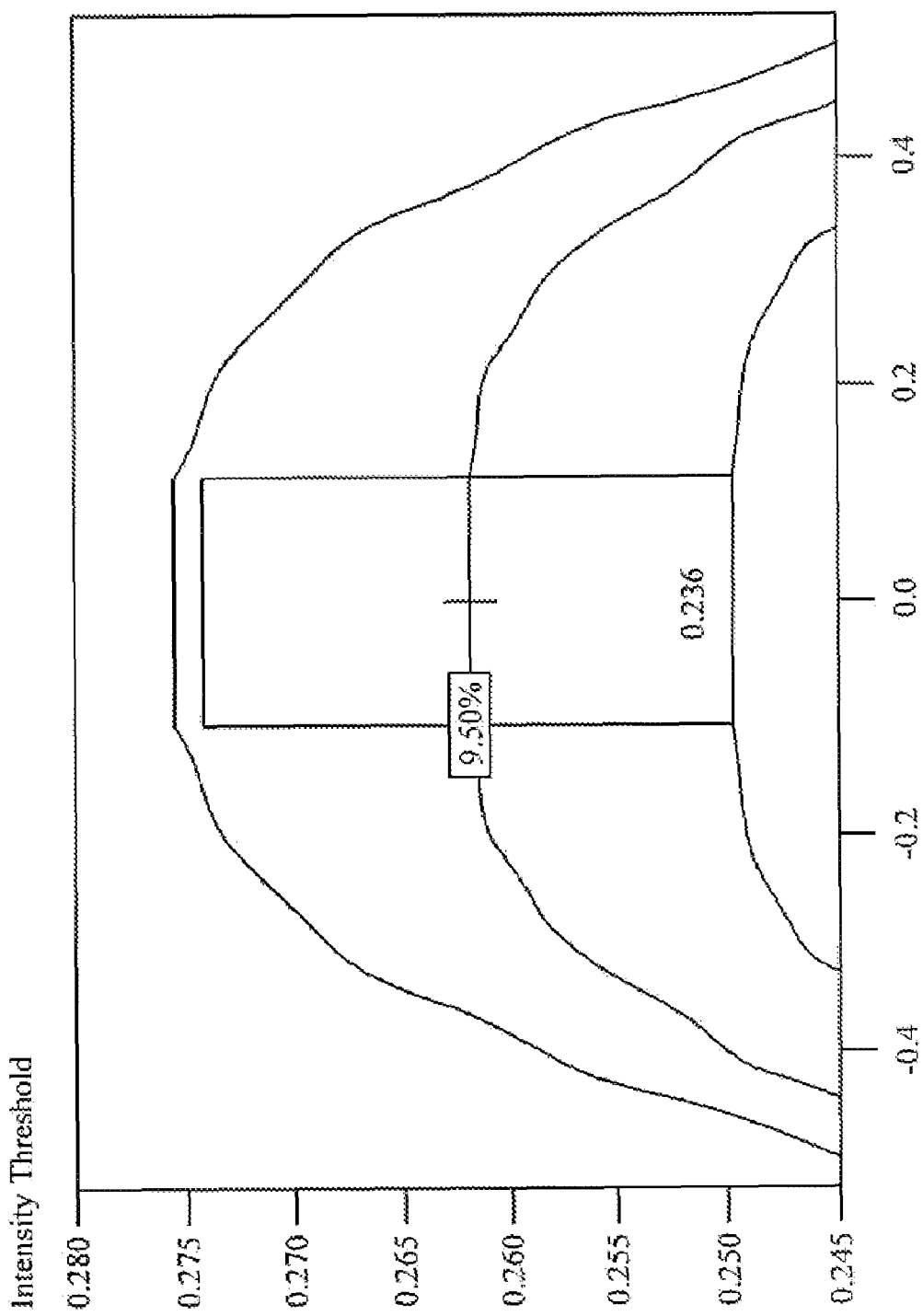
FIG. 3 is a graph showing an exposure-defocus plot of a continuously superimposed contact-hole wafer image.
Figure 4:
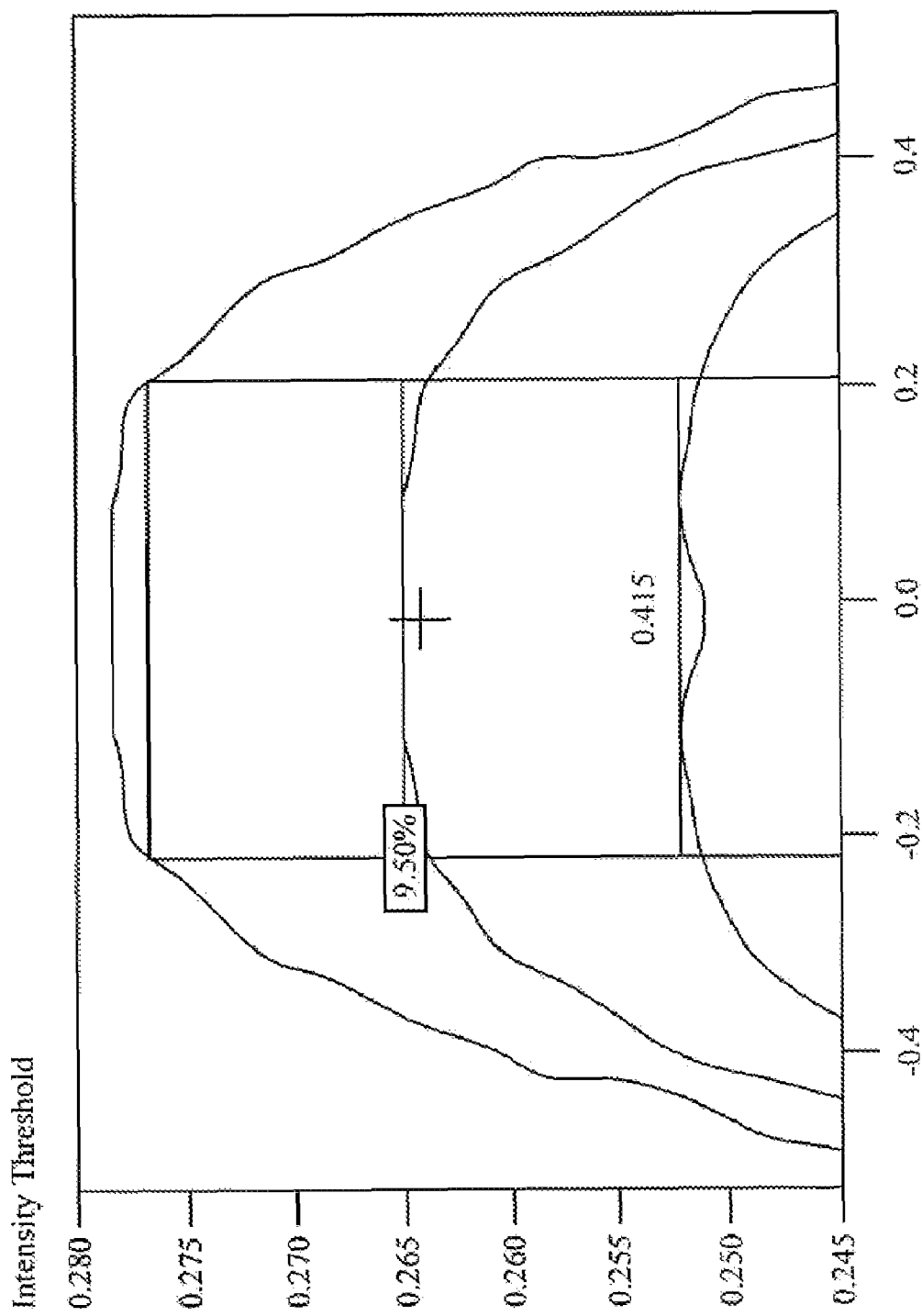
FIG. 4 is a graph showing an exposure-defocus plot of a contact-hole image scanned using discrete superimposition of two, discrete contact-hole wafer images.

The scanning method of the present invention is applicable to lithographic step-and-scan projection systems, an example of which is shown in FIG. 1. When the step-and-scan projection system of FIG. 1 is operated conventionally in the tilted mask or tilted wafer scanning mode to continuously superimpose wafer images, in a range of defocus, from a given mask pattern of the mask, the optical slit confines the illumination beam to a small image area of the mask to facilitate scanning of these image areas over a resist-coated wafer.

Figure 5:
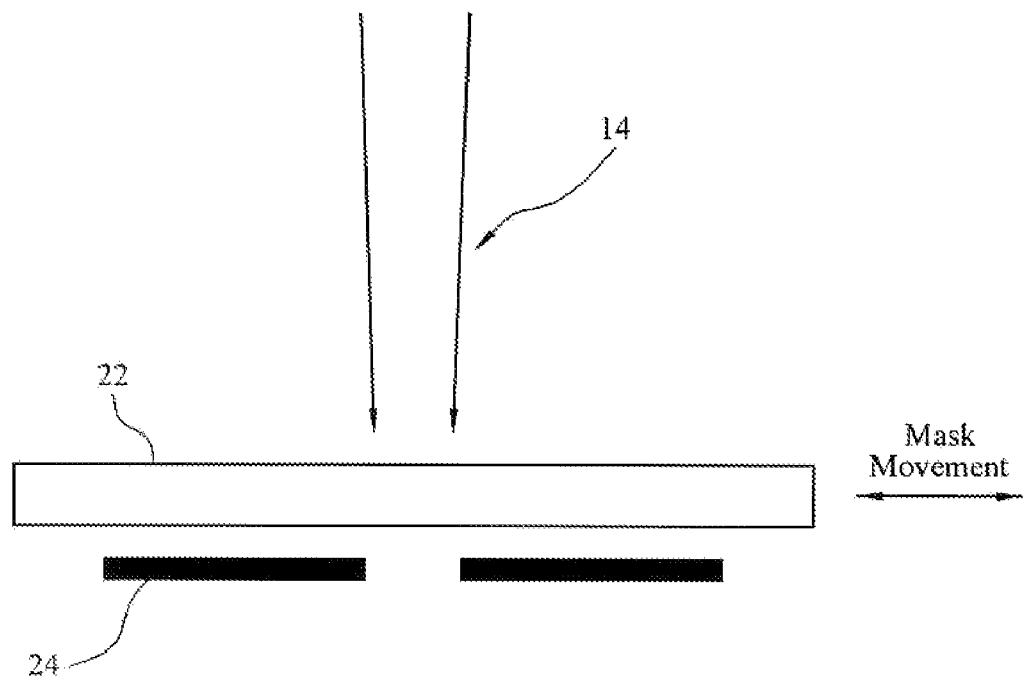
FIG. 5 is a schematic illustration of an illumination beam generated by the lithographic step-and-scan projection system of FIG. 1 when scanning conventionally.

The tilted mask operational mode is shown in FIG. 5. As can be seen, the mask 22 is tilted relative to a plane in which the mask 22 is one-dimensionally translated while scanning the mask 22 and the wafer 20 (which is two-dimensionally translated) in synchronization (in a reduction system, "in synchronization" means the mask is scanned at n times the speed of the wafer, where n is the magnification factor of the mask) with conventional illumination beam 14. Continuous superposition may also be accomplished by tilting the wafer stage 18 of the projection system 10 relative to a plane in which the wafer stage 18 is two dimensionally translated while scanning the mask 22 and the wafer 20 in synchronization.

In accordance with the scanning method of the present invention, scanning is performed with the mask or wafer in a tilted position and the illumination beam passing through the optical slit is divided or split (by dividing the optical slit in to two or more smaller slits) in the scanning direction to provide illumination areas in two or more different defocus zones, i.e., wafer images at two or more focuses. The tilted mask in combination with the divided optical slit or the tilted wafer in combination with the divided optical slit produce two or more defocus zones. The number of defocus zones is determined by the number of smaller optical slits. For example, if the optical slit is divided into two small slits, the number of defocus zones produce is two.

Figure 6:
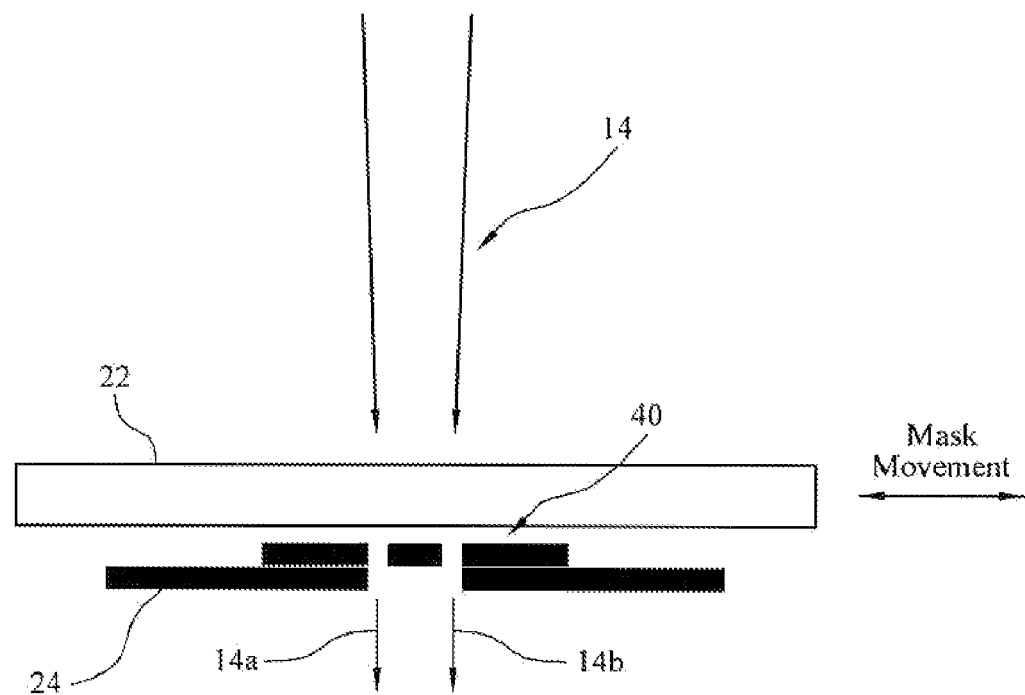
FIG. 6 is a schematic illustration of an illumination beam generated by lithographic step-and-scan projection system of FIG. 1 when scanning according to an embodiment of the present invention.

As shown in FIG. 6 the scanning method of present invention may implemented in the lithographic step and scan projection system shown in FIG. 1 by positioning an illumination beam blocking plate 40 over the optical slit 24 of the projection system 10 during tilted mask or wafer scanning to split the illumination beam 14 passing through the optical slit 24 in the scanning direction, i.e., the direction of the mask and wafer movements. The illumination beam blocking plate 40 is constructed to discretely block a selected area of the optical slit 24 so that two (or more) discrete, continuously superimposed defocal mask images of much smaller defocal distance ranges are illuminated by the illumination beams 14a and 14b on the resist-coated wafer 20, thus further improving the DOF in the tilted operating mode of the projection system.

Figure 12B:
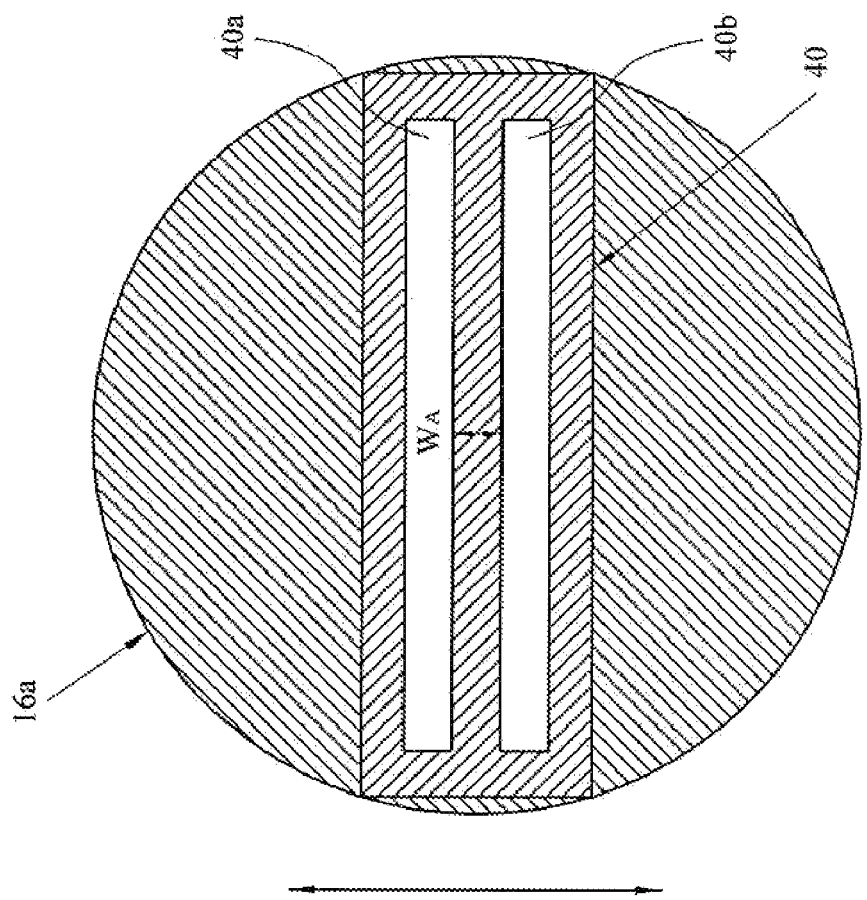
FIG. 12B is a plan view illustrating an exemplary embodiment of a beam blocking plate of the present invention.
Figure 12A:
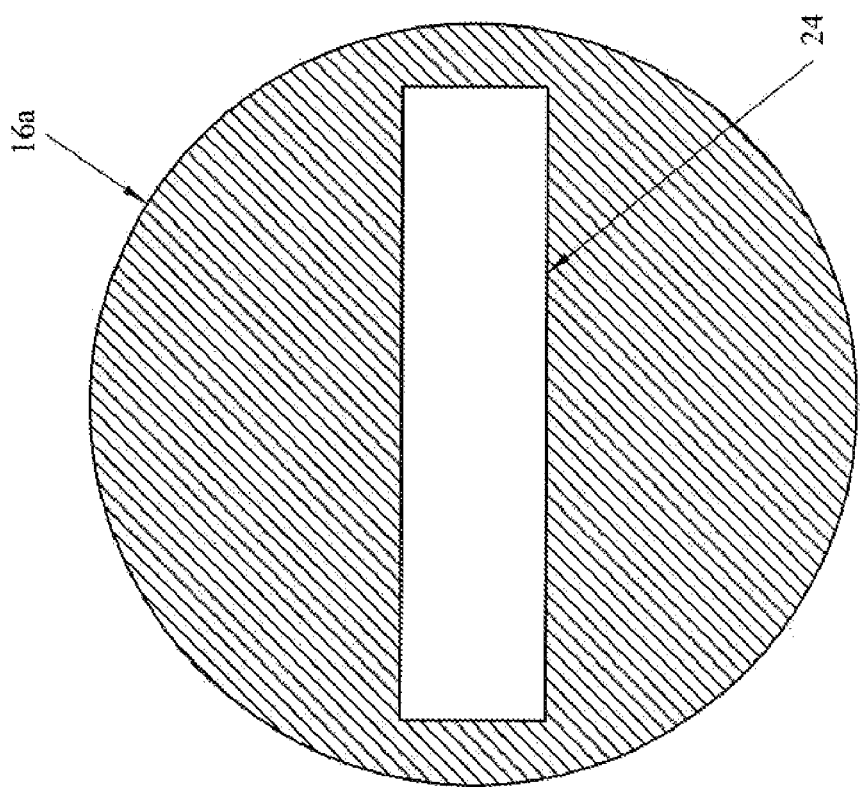
FIG. 12A is a plan view of the optical slit.

FIGS. 12A and 12B are plan views, which collectively illustrate an exemplary embodiment of the beam blocking plate 40 of the present invention. FIG. 12A shows the circular image field 16a of the lens system 16 (e.g. FIG. 1) and the optical slit 24 disposed within the image field 16a. FIG. 12B shows the beam blocking plate 40 disposed over the optical slit 24 of FIG. 12A. As shown in FIG. 12B, the beam blocking plate may be embodied as a rectangular planar member having two, parallel spaced slits 40a and 40b which are each smaller the slit 24. The size of the blocking area is determined by the width $W_A$ between the slits 40a and 40b. The larger the width $W_A$, the larger the defocal distance between the images from the two slits 40a and 40b will be, making the DOF extension more effective. However, more illumination will be blocked, reducing the optical efficiency.

Figure 7:
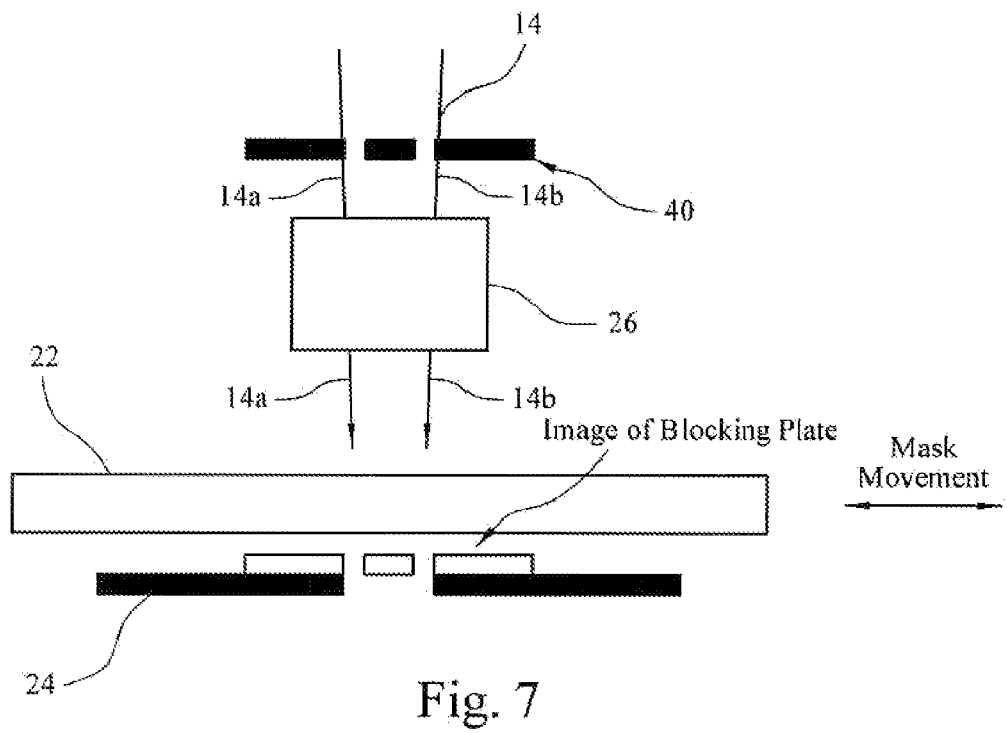
FIG. 7 is a schematic illustration of an illumination beam generated by lithographic step-and-scan projection system of FIG. 1 when scanning according to another embodiment of the present invention.

Alternatively as shown in FIG. 7, the scanning method of present invention may be implemented in the lithographic step and scan projection system shown in FIG. 1 by positioning an illumination beam blocking plate 40 at the conjugate plane of the mask 22 during tilted mask or wafer scanning to gain space between the bottom of the mask 22 and the optical slit 24 and to provide more accurate blocking. The illumination beam blocking plate 40 splits the illumination beam 14 in the scanning direction prior to it passing through the imaging lens 26 thereby producing an image of the blocking plate 40 on the mask 22. As in previous implementation of the method, two or more discrete, continuously superimposed defocal mask images of much smaller defocal distance ranges are illuminated by the beams 14a and 14b on the resist-coated wafer.

Figure 8:
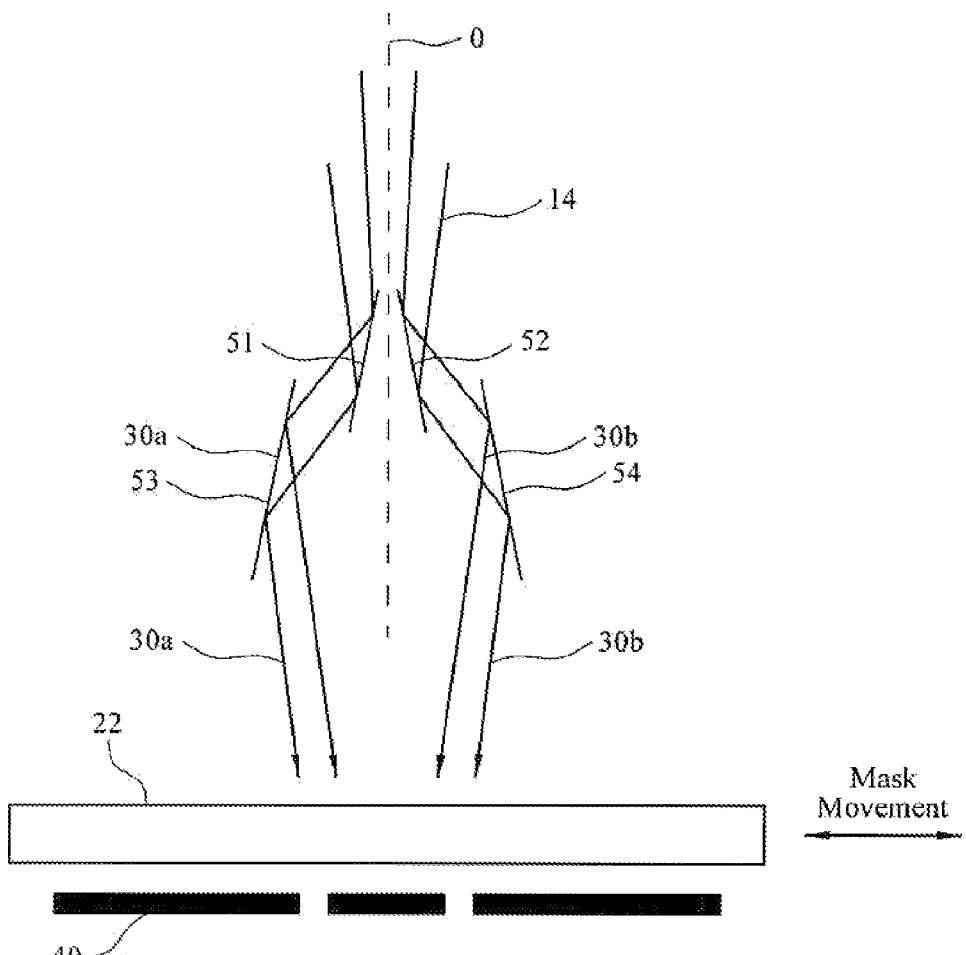
FIG. 8 is a schematic illustration of an illumination beam generated by lithographic step-and-scan projection system of FIG. 1 when scanning according to a further embodiment of the present invention.

Referring now to FIG. 8, a mirror assembly comprising a first pair of mirrors 51 and 52 and a second pair of mirrors 53 and 54 may be utilized with the illumination beam blocking plate 40 to preserve the efficiency of illumination system of the projection system of FIG. 1, as passive blocking may consume a quantity of the illumination. The mirrors 51, 52, 53, and 54 are each disposed at respective angle as measured relative to optical path O. The first pair of mirrors 51 and 52 split the illumination beam 14 into two smaller, separated, continuous zones or beams 30a and 30b of illumination, and the second pair of mirrors 53 and 54 redirect the beams 30a and 30b toward the optical slit 24 (shown blocked by blocking plate 40), thereby minimizing the loss of light. The blocking plate 40 in this embodiment serves only to better define the boundaries of the beams 30a and 30b. The angles of each continuous zone or beam 30a, 30b of illumination may be manipulated by changing angles of respective mirrors 51, 52, 53, and 54. For example, the mirror angles may be adjusted so that the first pair of mirrors 51 and 52 are substantially parallel to the second pair of mirrors 53 and 54. Such an arrangement preserves the spatial spectrum of the original illumination beam 14. Thus, the entire mirror assembly may be inserted or withdrawn from the optical path O without affecting the spectral frequency of the original illumination beam 14.

Figure 9:
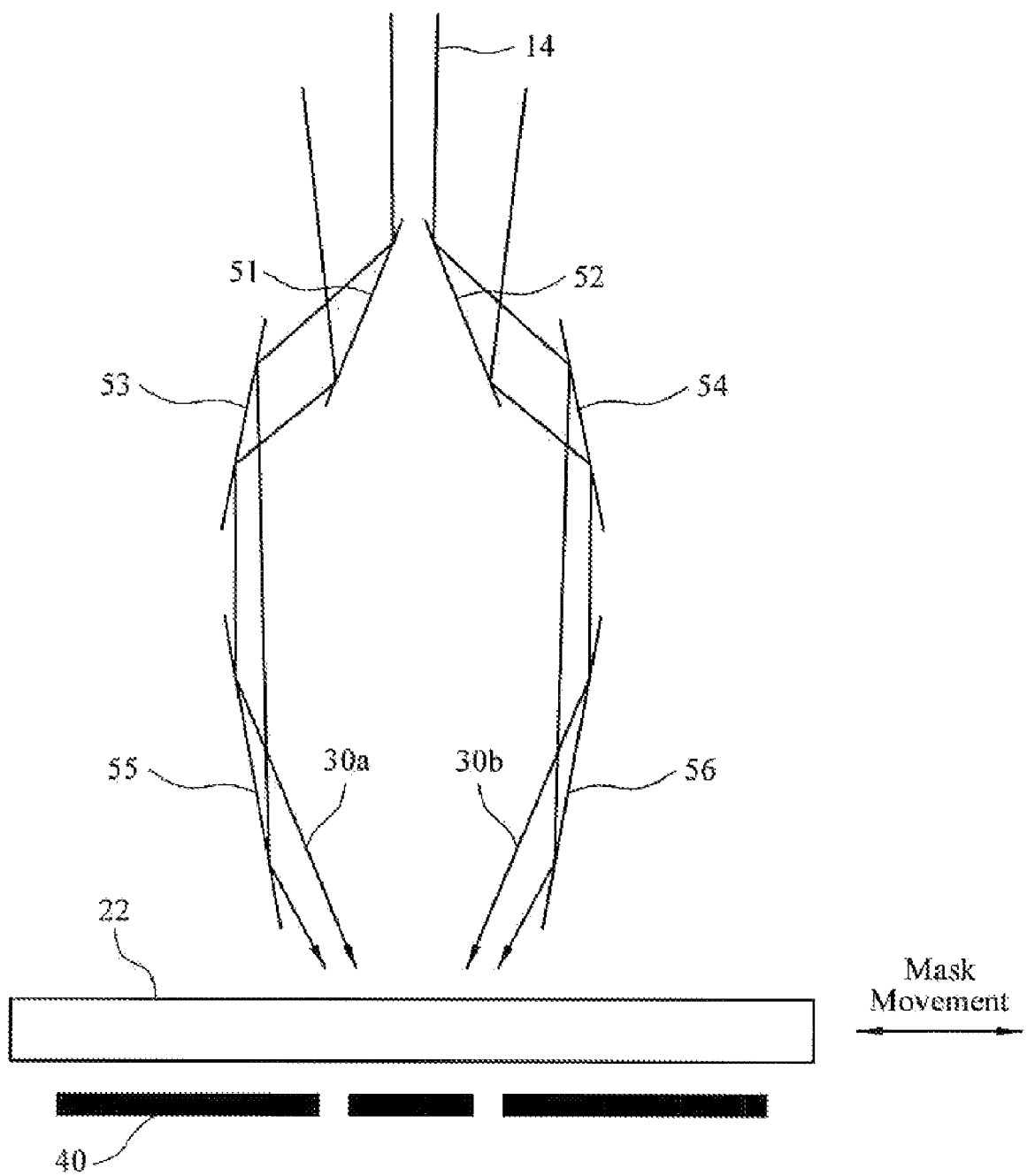
FIG. 9 is a schematic illustration of an illumination beam generated by lithographic step-and-scan projection system of FIG. 1 when scanning according to still a further embodiment of the present invention.

In FIG. 9, a third pair of mirrors 55 and 56 may utilized to allow further manipulate the angle and the position of the beams 30a and 30b.

Figure 10:
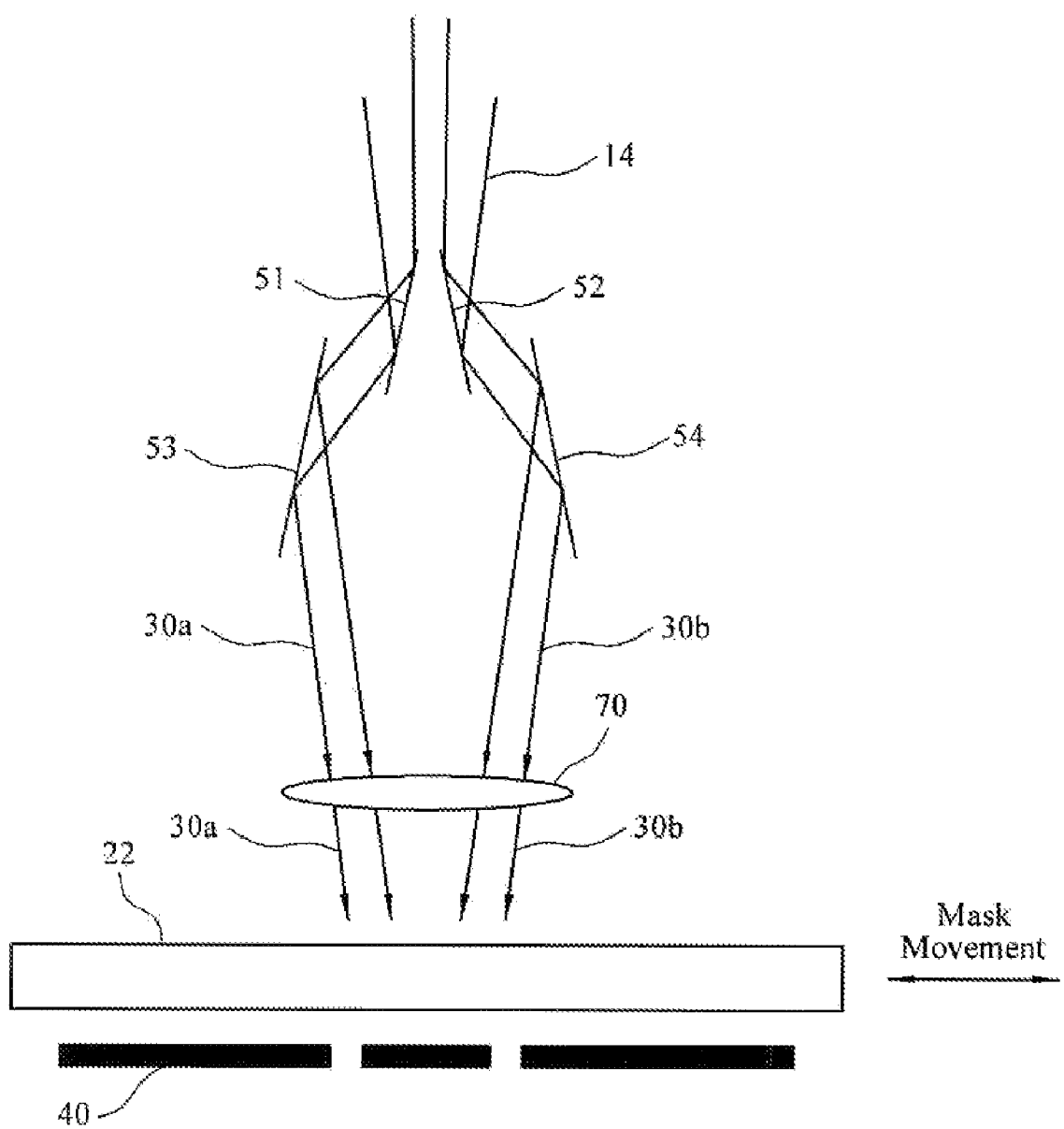
FIG. 10 is a schematic illustration of an illumination beam generated by lithographic step-and-scan projection system of FIG. 1 when scanning according to yet another embodiment of the present invention.

As shown in FIG. 10, the angle and the position of the beams 30a and 30b may also be further manipulated using a transmissive lens 70.

The first pair of mirrors may also be positioned to split the illumination beam 14 into more than two zones of light. For example, in FIG. 11, the first pair of mirrors 51 and 52 of the mirror assembly 50 are spaced apart from one another such that the illumination beam 14 is split into three smaller, separated, continuous zones or beams 30a, 30b, 30c of illumination.

Figure 11:
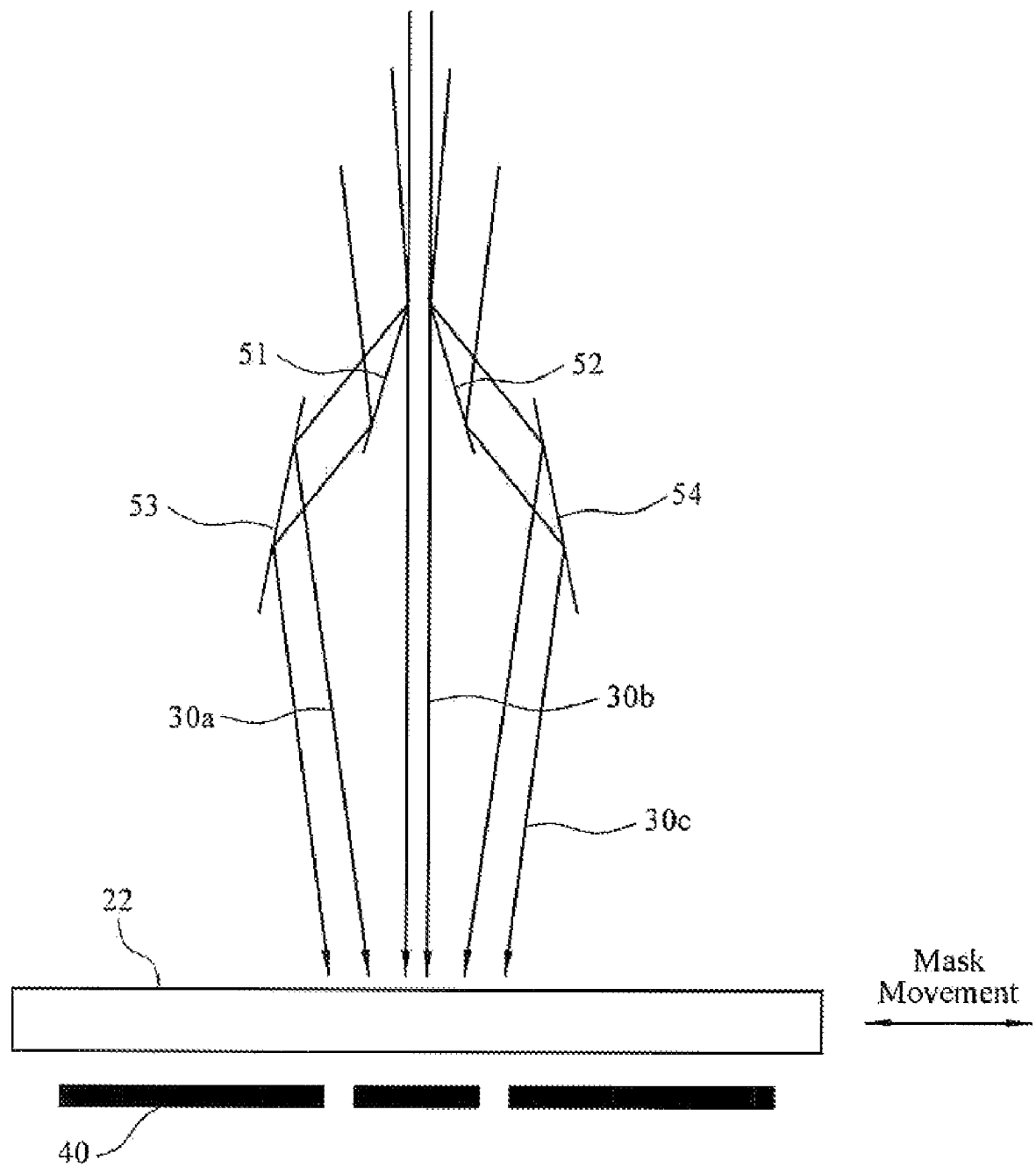
FIG. 11 is a schematic illustration of an illumination beam generated by lithographic step-and-scan projection system of FIG. 1 when scanning according to yet another embodiment of the present invention.

The mirror embodiments of FIGS. 8, 9 and 11 are directed to the purpose of making the illumination system compatible with optical systems that require strictly reflective elements, such as in extreme UV lithography where no transmissive material can be found.

Figure 13B:
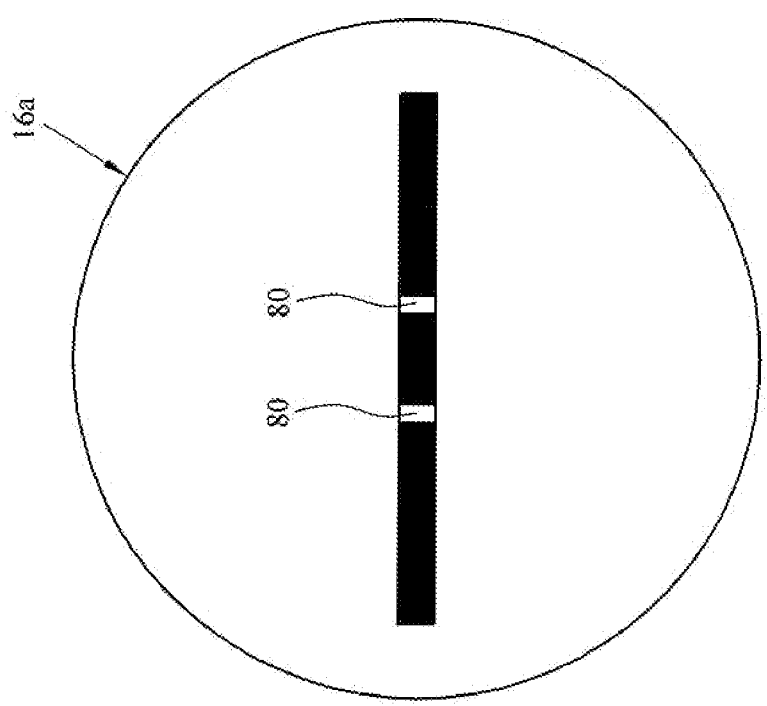
FIG. 13B is a plan view illustrating an exemplary embodiment of a gray-level filter of the present invention.

As shown collectively in FIGS. 13A and 13B, a gray level filter 80 may be utilized within the unblocked areas (the slits 40a and 40b) of blocking plate 40 or the blocking plate may have opaque areas to block the light and gray level areas to modify incoming light intensity. Within the unblocked areas, the light intensity is modified according to the optical density distribution of the gray level filter 80. More light is transmitted at the center of each slit and gradually decreases towards the edges and is totally blocked as it reaches the selected area.

While the foregoing invention has been described with reference to the above, various modifications and changes can be made without departing from the spirit of the invention. Accordingly, all such modifications and changes are considered to be within the scope of the appended claims.

What is claimed is:

1. A method of scanning comprising:
   tilting one of a mask and a wafer with respect to a scanning direction;
   splitting an illumination beam passing through an optical the slit into at least two illumination areas which are in different defocus zones of the mask, wherein the splitting is performed by blocking off an unwanted portion of the illumination beam with a blocking plate disposed between the mask and the wafer;
   providing a filter within unblocked areas of the blocking plate, the filter having an optical density distribution;
   modifying the intensity of illumination of the at least two illumination areas with the filter, the optical density distribution of the filter gradually reducing light transmitted across each unblocked area from a center thereof to an edge thereof; and
   creating a wafer image with the illumination of the modified intensity comprising a superimposition of the illumination as a function of defocusing.

2. The method of claim 1, wherein the blocking plate includes at least two slits which are smaller than an optical slit through which the illumination beam passes.

3. The method of claim 1, wherein the filter comprises a gray-level filter.

4. The method of claim 1, further comprising splitting the illumination beam with at least one of a mirror, a plurality of mirrors, a minor and a lens, a mirror and a plurality of lenses, and a plurality of minors and a plurality of lenses prior to splitting the illumination beam with the blocking plate.

5. The method of claim 1, further comprising splitting the illumination beam with a plurality of mirrors, some of the mirrors being substantially parallel to one another prior to splitting the illumination beam with the blocking plate.

6. A method of scanning comprising:
   tilting at least one of a mask and a wafer with respect to a scanning direction;
   providing a filter between the mask and the wafer, the filter having an optical density distribution;
   modifying the intensity of illumination provided to a slit in the scanning direction with the filter, the optical density distribution of the filter gradually reducing light transmitted across the slit from a center thereof to an edge thereof; and
   creating a wafer image with the illumination of the modified intensity comprising a superimposition of the illumination as a function of defocusing.

7. A lithographic step-and-scan projection system comprising:
   an illumination source for generating an illumination beam;
   a holder for holding and tilting one of a wafer and a mask, the holder tilting one of the wafer and the mask with respect to a scanning direction;
   a blocking plate for splitting the illumination beam passing through an optical slit into at least two illumination areas which are in different defocus zones of the mask, wherein the divider is disposed between the mask and the wafer; and
   a filter disposed within unblocked areas of the blocking plate, the filter having an optical density distribution for modifying the intensity of illumination of the at least two illumination areas, the optical density distribution of the filter gradually reducing light transmitted across each unblocked area from a center thereof to an edge thereof, thereby creating a wafer image with the illumination of the modified intensity comprising a superimposition of the illumination as a function of defocusing.

8. The system of claim 7, wherein the blocking plate includes at least two slits which are smaller than an optical slit through which the illumination beam passes.

9. The system of claim 7, wherein the filter comprises a gray-level filter.

10. The system of claim 7, further comprising at least one of a minor, a plurality of mirrors, a mirror and a lens, a minor and a plurality of lenses, and a plurality of minors and a plurality of lenses for splitting the illumination beam prior to splitting the illumination bean, with the blocking plate.

11. The system of claim 7, further comprising a plurality of mirrors for splitting the illumination beam into the at least two illumination areas, wherein some of the minors are substantially parallel to one another.

12. The method of claim 6, wherein the filter comprises a gray-level filter.

13. The method of claim 6, wherein the illumination provided to the slit comprises an illumination beam and further comprising splitting the illumination beam with at least one of a mirror, a plurality of mirrors, a mirror and a lens, a mirror and a plurality of lenses, and a plurality of mirrors and a plurality of lenses.

14. The method of claim 6, wherein the illumination provided to the slit comprises an illumination beam and further comprising splitting the illumination beam with a plurality of mirrors, some of the minors being substantially parallel to one another.

15. The method of claim 6, wherein the illumination provided to the slit comprises an illumination beam and further comprising splitting the illumination beam projecting through the slit into at least two illumination beams as the illumination beam passes through the slit.

16. The method of claim 6, wherein the illumination provided to the slit comprises an illumination beam and further comprising splitting the illumination beam by blocking off an unwanted portion of the illumination beam.

17. The method of claim 16, wherein the blocking is performed with a blocking plate.

18. The method of claim 17, wherein the slit through which the illumination beam passes comprises an optical slit and wherein the blocking plate includes at least two slits which are smaller than the optical slit.

19. The method of claim 17, wherein the blocking plate is disposed over the slit.

20. The method of claim 17, wherein the blocking plate is disposed at a conjugate plane of the mask.

21. The method of claim 17, wherein the filter is disposed within an unblocked area of the blocking plate or the filter is an opaque area of the blocking plate.

* * * * *

UNITED STATES PATENT AND TRADEMARK OFFICE
CERTIFICATE OF CORRECTION

| | | |
|---|---|---|
| PATENT NO. | : 7,667,821 B2 | Page 1 of 1 |
| APPLICATION NO. | : 11/064322 | |
| DATED | : February 23, 2010 | |
| INVENTOR(S) | : Burn-J Lin et al. | |

It is certified that error appears in the above-identified patent and that said Letters Patent is hereby corrected as shown below:

Column 5, Line 53, delete "minor" and insert -- mirror --.

Column 5, Line 54, delete "minors" and insert -- mirrors --.

Column 6, Line 34, delete both occurrences of "minor" and insert -- mirror --.

Column 6, Line 35, delete "minors" and insert -- mirrors --.

Column 6, Line 37, delete "bean" and insert -- beam --.

Column 6, Line 40, delete "minors" and insert -- mirrors --.

Column 6, Line 53, delete "minors" and insert -- mirrors --.

Signed and Sealed this

Eleventh Day of May, 2010

David J. Kappos
*Director of the United States Patent and Trademark Office*